United States Patent
Motokawa et al.

(10) Patent No.: US 8,834,674 B2
(45) Date of Patent: Sep. 16, 2014

(54) PLASMA ETCHING APPARATUS

(75) Inventors: Takeharu Motokawa, Zushi (JP);
Hidehito Azumano, Yokohama (JP)

(73) Assignees: Kabushiki Kaisha Toshiba, Tokyo (JP);
Shibaura Mechatronics Corporation, Kanagawa (JP)

(*) Notice: Subject to any disclaimer, the term of this patent is extended or adjusted under 35 U.S.C. 154(b) by 884 days.

(21) Appl. No.: 12/787,948

(22) Filed: May 26, 2010

(65) Prior Publication Data

US 2010/0300623 A1    Dec. 2, 2010

(30) Foreign Application Priority Data

May 29, 2009    (JP) .................. 2009-131467

(51) Int. Cl.
| | | |
|---|---|---|
| C23F 1/08 | (2006.01) | |
| H01L 21/306 | (2006.01) | |
| H01J 37/32 | (2006.01) | |
| G03F 1/46 | (2012.01) | |

(52) U.S. Cl.
CPC ....... *H01J 37/32642* (2013.01); *H01J 37/3255* (2013.01); *H01J 37/32623* (2013.01); *H01J 37/32541* (2013.01); *G03F 1/46* (2013.01); *H01J 2237/03* (2013.01); *H01J 2237/022* (2013.01)
USPC ............. 156/345.51; 156/345.3; 156/345.47

(58) Field of Classification Search
USPC ............. 156/345.3, 345.51, 345.44, 345.45, 156/345.46, 345.47, 345.43; 118/723 E, 118/723 R, 723 VE, 720, 721, 728, 729, 730, 118/345.51
See application file for complete search history.

(56) References Cited

U.S. PATENT DOCUMENTS

| | | | | | |
|---|---|---|---|---|---|
| 5,262,029 | A | * | 11/1993 | Erskine et al. ........... | 204/298.15 |
| 5,439,524 | A | * | 8/1995 | Cain et al. ................ | 118/723 E |
| 5,456,757 | A | * | 10/1995 | Aruga et al. .............. | 118/723 E |
| 5,529,657 | A | * | 6/1996 | Ishii ......................... | 156/345.26 |
| 5,748,434 | A | * | 5/1998 | Rossman et al. ............. | 361/234 |
| 5,843,237 | A | * | 12/1998 | Chun .......................... | 118/728 |
| 6,074,518 | A | * | 6/2000 | Imafuku et al. .......... | 156/345.46 |
| 6,077,353 | A | * | 6/2000 | Al-Sharif et al. ............ | 118/500 |
| 6,171,438 | B1 | * | 1/2001 | Masuda et al. .......... | 156/345.27 |
| 6,306,244 | B1 | * | 10/2001 | Kennedy et al. ......... | 156/345.51 |
| 6,350,698 | B1 | * | 2/2002 | Kamide ...................... | 438/715 |
| 6,723,202 | B2 | * | 4/2004 | Nagaiwa et al. ......... | 156/345.43 |

(Continued)

FOREIGN PATENT DOCUMENTS

| | | |
|---|---|---|
| JP | 7-58083 | 3/1995 |
| JP | 2000-21861 | 1/2000 |

(Continued)

OTHER PUBLICATIONS

Machine Generated English Translation of JP 7-058083. Published Mar. 3, 1995.*

(Continued)

*Primary Examiner* — Sylvia R MacArthur

(74) *Attorney, Agent, or Firm* — Finnegan, Henderson, Farabow, Garrett & Dunner, LLP

(57) ABSTRACT

According to one embodiment, a plasma etching apparatus includes an electrode to which a high-frequency voltage is applied, having an upper surface along which a processing target substrate is to be placed, and having an inclined side, and an electrode cover provided along the side of the electrode.

8 Claims, 4 Drawing Sheets

(56) References Cited

U.S. PATENT DOCUMENTS

2005/0005859 A1* 1/2005 Koshiishi et al. ............ 118/728
2006/0292727 A1 12/2006 Motokawa et al.
2010/0300623 A1* 12/2010 Motokawa et al. ...... 156/345.51

FOREIGN PATENT DOCUMENTS

| JP | 2003163201 A * | 6/2003 |
| JP | 2003-243366 | 8/2003 |
| JP | 2005064460 A * | 3/2005 |
| JP | 2005-255507 | 9/2005 |
| JP | 2006-332336 | 12/2006 |
| JP | 2008-244274 | 10/2008 |

OTHER PUBLICATIONS

First Office Action mailed Feb. 26, 2013, from the Japanese Patent Office in corresponding Japanese Patent Application No. JP 2009-131467, and English translation of the First Office Action (5 pages total).

* cited by examiner

PLASMA ETCHING APPARATUS

CROSS-REFERENCE TO RELATED APPLICATIONS

This application is based upon and claims the benefit of priority from Japanese Patent Application No. 2009-131467, filed May 29, 2009; the entire contents of which are incorporated herein by reference.

FIELD

Embodiments described herein relate generally to a plasma etching apparatus.

BACKGROUND

A plasma etching apparatus is required to satisfy the following point; specifically, it is important to configure the foregoing apparatus so that particles generated during etching do not adhere onto a substrate. In particular, in a plasma etching process for forming a photomask pattern, it is extremely important to prevent adhesion of particles in order to form a pattern having no defect. Moreover, the following proposal has been made; specifically, a plasma etching apparatus is provided with an electrode cover for protecting an electrode from plasma (e.g., see Jpn. Pat. Appln. KOKAI Publication No. 2006-332336).

However, according to a conventional case, the optimum structure for preventing adhesion of particles has not been proposed in a plasma etching apparatus provided with an electrode cover.

DETAILED DESCRIPTION

Various embodiments will be hereinafter described with reference to the accompanying drawings.

(First Embodiment)

Figure 1:
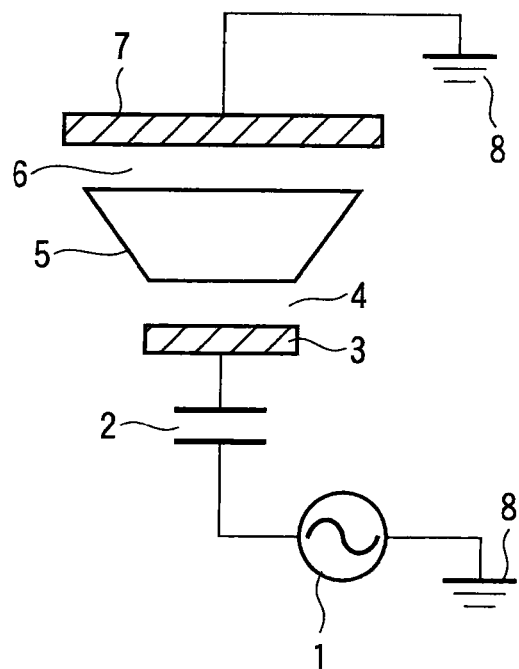
FIG. 1 is a view showing the basic structure and function of a plasma etching apparatus.

The basic structure and function of a plasma etching apparatus will be explained below with reference to FIG. 1.

A processing target substrate, that is, a photomask substrate (not shown) is held along the upper surface of a bottom electrode 3. Usually, most of a photomask substrate is not in contact with the bottom electrode 3 so that the backside of the photomask substrate does not receive damage. For this reason, a clearance exists between the photomask substrate and the bottom electrode 3. Moreover, the surface of the bottom electrode 3 is provided with a dielectric material (not shown) such as silica and ceramic to suppress damage from plasma.

A chamber (not shown) is exhausted by means of a vacuum pump. A space between bottom and top electrodes 3 and 7 arranged in the chamber is set to the optimum pressure for generating plasma. Specifically, the space is adjusted to the optimum pressure in a state that an etching process gas is supplied between the foregoing two electrodes. Then, the pressure is adjusted, and thereafter, a high-frequency voltage (high-frequency power) is applied from a high-frequency power source 1 to an electrode. In this way, a high-frequency field is generated in a process gas. Electrons contained in the process gas are accelerated by the generated high-frequency field, and then, the process gas is ionized by the accelerated electrons. As a result, plasma 5 is generated between bottom and top electrodes 3 and 7. When plasma is generated, a space charge layer is formed between plasma and an electrode. Namely, a plasma sheath 4 is formed near the bottom electrode 3 while a plasma sheath 6 is formed near the top electrode 7.

A direct-current block capacitor 2 is interposed between the high-frequency power source 1 and the bottom electrode 3. The foregoing capacitor 2 is arranged; therefore, discharge is stabilized, and damage against electrodes is reduced. The foregoing high-frequency power source 1 and top electrode 7 are connected to a ground 8. The voltage of the ground 8 is set to 0 volt.

Figure 2:
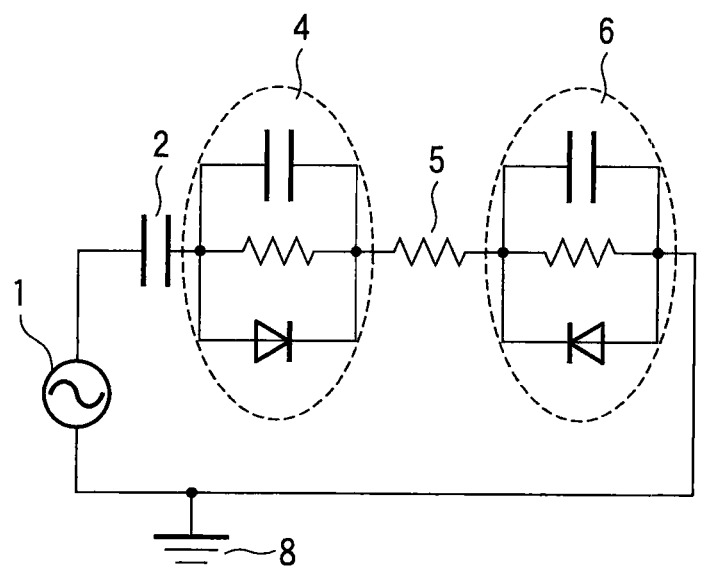
FIG. 2 is an equivalent circuit diagram showing a state that plasma is generated by a plasma etching apparatus.

FIG. 2 is an equivalent circuit diagram showing a state that plasma is generated by means of the foregoing plasma etching apparatus.

Plasma sheathes 4 and 6 function as a space charge layer having a rectifying effect. In a state that plasma 5 is stably maintained, the potential of the foregoing sheathes becomes lower than the potential of plasma. In plasma, a high-frequency power is absorbed by Joule heat. Considering the foregoing matters, plasma sheathes 4 and 6 are both expressed using a parallel connection of a rectifier, electric resistance and a capacitor. The plasma 5 is expressed using an electric resistance.

As can be seen from the foregoing description, the state that plasma is generated by the foregoing plasma etching apparatus is expressed by an equivalent circuit diagram of FIG. 2. The following point can be seen from the equivalent circuit diagram of FIG. 2. Specifically, when a dielectric material exists on the surface of the bottom electrode 3, if an electric capacitance of the dielectric material changes, the plasma sheath 4 formed above the dielectric material changes.

Figure 3:
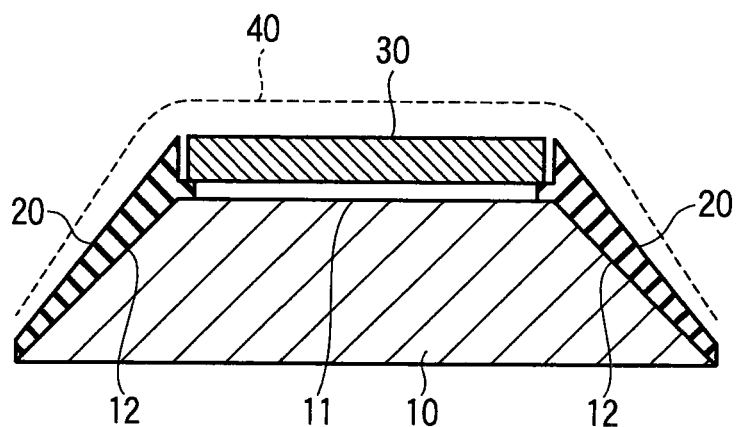
FIG. 3 is a cross-sectional view schematically showing a state of the vicinity of a bottom electrode of a plasma etching apparatus according to a first embodiment.
Figure 4:
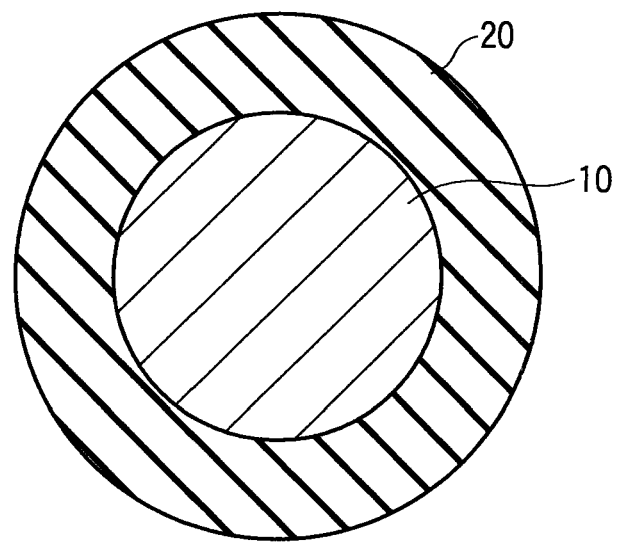
FIG. 4 is a top plan view schematically showing the structure of a bottom electrode and an electrode cover according to a first embodiment.

FIG. 3 is a cross-sectional view schematically showing a state of the vicinity of a bottom electrode of a plasma etching apparatus according to this first embodiment. FIG. 4 is a top plan view schematically showing the structure of a bottom electrode and an electrode cover shown in FIG. 3. In this case, the basic structure of the plasma etching apparatus is the same as shown in FIG. 1.

As seen from FIG. 3 and FIG. 4, a bottom electrode 10 has a taper shape. Namely, the bottom electrode 10 has an inclined side 12. Moreover, as shown in FIG. 4, the bottom electrode 10 has a circular plane, and further, the upper surface 11 of the bottom electrode 10 is circle. A high-frequency voltage (high-frequency power) for generating plasma is applied to the bottom electrode 10 from a high-frequency power source (not shown).

The side of the bottom electrode 10 is provided with an electrode cover 20, which is formed of a dielectric material (insulator). Specifically, a ring-like electrode cover 20 is attached along the side of the bottom electrode 10. Therefore, the side of the bottom electrode 10 is covered with the electrode cover 20. The side 12 of the bottom electrode 10 is inclined; for this reason, the surface of the electrode cover 20 is inclined. Moreover, the thickness (i.e., the direction vertical to the side of the bottom electrode 10) of the electrode cover 20 changes in the radius direction. Specifically, the electrode cover 20 becomes gradually thin from the upper surface of the bottom electrode 10 toward the lower surface thereof.

A processing target substrate, that is, photomask substrate 30 is placed along the upper surface of the bottom electrode 10. Specifically, the photomask substrate 30 is placed on a substrate placement portion of the electrode cover 20. A clearance exists between the photomask substrate 30 and the bottom electrode 10. In this case, the surface of the photomask substrate 30 is formed with an etching target film such as a metal film and a resist pattern.

A plasma sheath 40 is formed along the surface of the electrode cover 20 and the surface of the photomask substrate 30. Therefore, the plasma sheath 40 has a taper shape. The electrode cover 20 is formed of a dielectric material; for this reason, an electric field above the electrode cover 20 depends on the dielectric constant and thickness of the electrode cover 20. Therefore, the plasma sheath 40 formed along the electrode cover 20 depends on the shape, thickness and dielectric constant of the electrode cover 20.

According to this embodiment, the bottom electrode 10 and the electrode cover 20 have the foregoing structure; therefore, it is possible to prevent adhesion of particles to the photomask substrate 30. The following explanation is further added.

Usually, the mass of particles remaining in a plasma etching apparatus is very small, and the influence by gravity is small. Thus, particles are usually controlled by means of an electric force. Moreover, particles reached the plasma sheath stay or reflect on the surface of the plasma sheath.

An electric force is balanced in particles staying in the plasma sheath surface; for this reason, the influence by gravity is not ignored. Moreover, a plasma sheath vibrates with respect to the plasma sheath surface by the influence of high frequency applied to the bottom electrode 10. For this reason, particles on the plasma sheath surface receive the influence by the foregoing vibration. Considering the foregoing factors, particles move toward the outer peripheral portion (outer peripheral edge) of the bottom electrode 10. Specifically, the side of the bottom electrode 10 is inclined, and the surface of the electrode cover 20 is inclined as well as the bottom electrode 10. Therefore, particles move downwardly along the foregoing inclination. Namely, particles move toward the outer peripheral portion of the bottom electrode 10. Then, particles reaching the outer peripheral portion of the bottom electrode 10 are exhausted outside the etching apparatus.

As described above, according to this embodiment, the bottom electrode 10 has the inclined side, and is provided with the electrode cover 20 along the side of the bottom electrode 10. Therefore, it is possible to effectively move particles toward the outer peripheral portion of the bottom electrode 10. As a result, this serves to prevent adhesion of particles to the photomask substrate 30, and to form a photomask pattern in which defect is suppressed.

Moreover, according to this embodiment, the thickness of the electrode cover 20 changes in the radius direction. Namely, the thickness of the electrode cover 20 gradually decreases toward the outer peripheral portion of the bottom electrode 10 (outer peripheral portion of electrode cover 20). In general, if the electrode cover is formed thin, the etching rate of an etching target becomes high. Therefore, according to this embodiment, it is possible to effectively remove reaction products (i.e., reaction products generated by etching) deposited near the outer peripheral portion of the electrode cover 20. As a result, a photomask pattern in which defect is more suppressed is formed.

(Second Embodiment)

Figure 5:
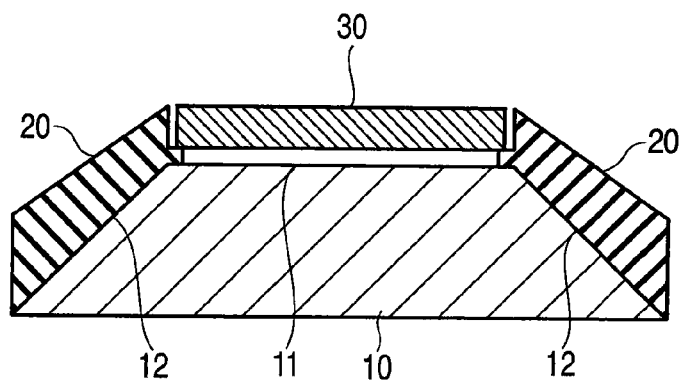
FIG. 5 is a cross-sectional view schematically showing a state of the vicinity of a bottom electrode of a plasma etching apparatus according to a second embodiment.

FIG. 5 is a cross-sectional view schematically showing a state of the vicinity of a bottom electrode of a plasma etching apparatus according to a second embodiment. The basic matters are the same as the first embodiment. Therefore, the explanations of matters described in the first embodiment and matters easily anticipated from the first embodiment are omitted.

According to the first embodiment, the thickness of the electrode cover 20 gradually decreases toward the outer peripheral portion of the bottom electrode 10 (outer peripheral portion of the electrode cover 20). In this case, it is possible to effectively remove reaction products deposited near the outer peripheral portion of the electrode cover 20. However, if there is a few of the deposited amount of reaction products, the electrode cover 20 is etched. This is a factor of increasing particles.

According to this embodiment, as can be seen from FIG. 5, the thickness of the electrode cover 20 gradually increases toward the outer peripheral portion of the bottom electrode 10 (outer peripheral portion of the electrode cover 20). The foregoing structure is provided, and thereby, it is possible to effectively prevent the electrode cover 20 from being etched near the outer peripheral portion of the electrode cover 20. As a result, this serves to prevent particles generated by etching the electrode cover 20, and to form a photomask pattern in which defect is suppressed.

(Third Embodiment)

Figure 6:
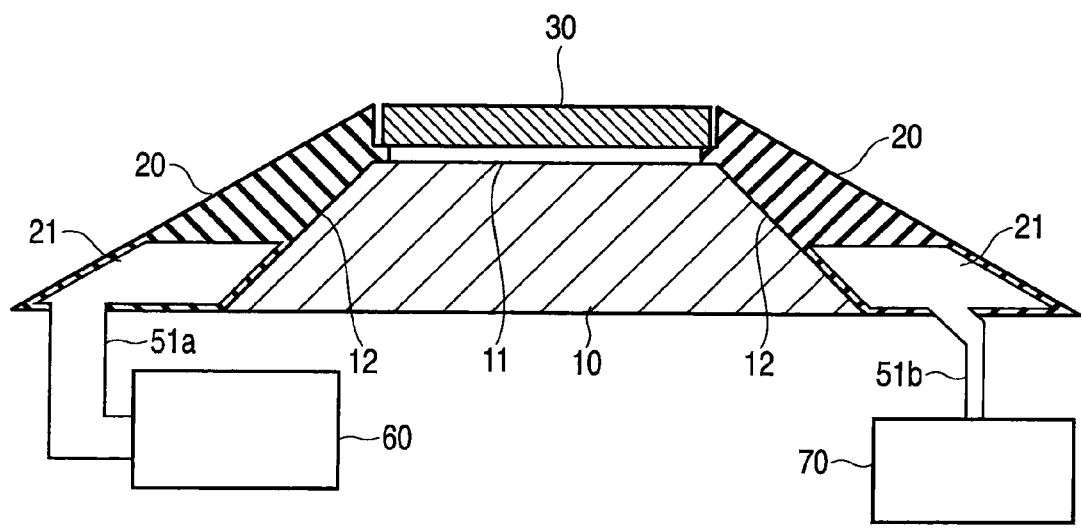
FIG. 6 is a schematic view to explain a state of the vicinity of a bottom electrode of a plasma etching apparatus according to a third embodiment.

FIG. 6 is a cross-sectional view schematically showing a state of the vicinity of a bottom electrode of a plasma etching apparatus according to a third embodiment. The basic matters are the same as the first and second embodiments. Therefore, the explanations of matters described in the first and second embodiments and matters easily anticipated from the first and second embodiments are omitted.

According to this embodiment, the inside of an electrode cover 20 is provided with a liquid reservoir 21 for reserving liquid along the circumferential direction of the electrode cover 20. In other words, the inside of the electrode cover 20 is formed with a cavity. In the liquid reservoir 21, the cavity is filled with liquid.

The liquid reservoir 21 is connected with pipes 51*a* and 51*b*. The pipe 51*a* is connected with a liquid supply unit 60. In the liquid supply unit 60, a desired liquid (having a desired dielectric constant) is selectable. The selected liquid is supplied to the liquid reservoir 21 by way of the pipe 51*a*. The pipe 51*b* is connected with a liquid recovery unit 70. The liquid recovery unit 70 recovers liquid reserved in the liquid reservoir 21 by way of the pipe 51*b*.

As can be seen from the foregoing description, according to this embodiment, it is possible to supply liquid having a desired dielectric constant to the liquid reservoir 21. This serves to adjust the dielectric constant of at least partial area of the electrode cover 20. Therefore, an electric field above the electrode cover 20 and plasma sheath are set to a suitable state. As a result, it is possible to more accurately control the removal of particles and the etching state.

(Fourth Embodiment)

Figure 7:
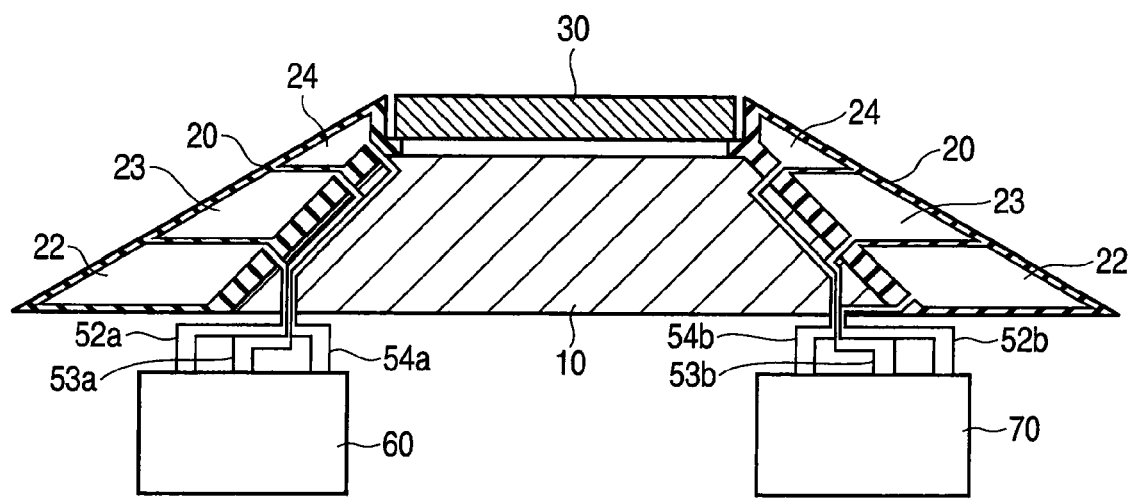
FIG. 7 is a schematic view to explain a state of the vicinity of a bottom electrode of a plasma etching apparatus according to a fourth embodiment.

FIG. 7 is a view schematically showing a state of the vicinity of a bottom electrode of a plasma etching apparatus according to a fourth embodiment. The basic matters are the same as the first to third embodiments. Therefore, the explanations of matters described in the first to third embodiments and matters easily anticipated from the first to third embodiments are omitted.

According to this embodiment, the inside of an electrode cover 20 is provided with a plurality of liquid reservoirs 22, 23 and 24 for reserving liquid along the circumferential direction of the electrode cover 20. In other words, the inside of the electrode cover 20 is formed with a plurality of cavities. In liquid reservoirs 22, 23 and 24, these cavities are filled with liquid.

The liquid reservoir 22 is connected with pipes 52a and 52b. The liquid reservoir 23 is connected with pipes 53a and 53b. The liquid reservoir 24 is connected with pipes 54a and 54b. These pipes 52a, 53a and 54a are connected with a liquid supply unit 60. In the liquid supply unit 60, a desired liquid (having a desired dielectric constant) is selectable. Specifically, liquids to be supplied to liquid reservoirs 22, 23 and 24 are independently selectable. Selected liquids are supplied to liquid reservoirs 22, 23 and 24 by way of pipes 52a, 53a and 54a, respectively. Therefore, liquid having different dielectric constant is supplied to liquid reservoirs 22, 23 and 24. Pipes 52b, 53b and 54b are connected with a liquid recovery unit 70. The liquid recovery unit 70 recovers liquids reserved in liquid reservoirs 22, 23 and 24 by way of pipes 52b, 53b and 54b.

As described above, according to this embodiment, liquid having a desired dielectric constant is supplied independently to liquid reservoirs 22, 23 and 24. Therefore, the dielectric constant is changed in the radius direction of the electrode cover 20. As a result, it is possible to configure an electrode cover 20 having a desired dielectric constant distribution. Thus, an electric field above the electrode cover 20 and plasma sheath are set to a suitable state. As a result, it is possible to more accurately control the removal of particles and the etching state.

The foregoing first to fourth embodiments relate to a parallel plate type plasma etching apparatus, which generates plasma between bottom and top electrodes. The first to fourth embodiments are applicable to other plasma etching apparatus. In other words, the same effect as described in the foregoing each embodiment is obtained so long as a plasma etching apparatus having the bottom electrode and the electrode cover described in the foregoing each embodiment is provided.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A plasma etching apparatus comprising:
an electrode to which a high-frequency voltage is applied, having an electrode upper surface along which a processing target substrate is to be placed and an electrode lower surface, and having an inclined side such that the electrode widens toward the electrode lower surface; and
an electrode cover provided along and covering the inclined side of the electrode, protecting the inclined side of the electrode from plasma, and having inclined upper and lower surfaces, wherein a thickness of the electrode cover between the inclined electrode cover upper and lower surfaces decreases in a direction from the electrode upper surface toward the electrode lower surface.

2. The apparatus according to claim 1, wherein the electrode cover has a ring shape.

3. The apparatus according to claim 1, wherein the electrode cover is formed of a dielectric material.

4. The apparatus according to claim 1, wherein the electrode has a circular plane.

5. The apparatus according to claim 1, wherein the electrode functions as a bottom electrode, and further comprising a top electrode parallel with the bottom electrode.

6. The apparatus according to claim 1, wherein a clearance exists between the electrode and the processing target substrate.

7. The apparatus according to claim 1, wherein the processing target substrate is a photomask.

8. The apparatus according to claim 1, wherein the electrode cover has a substrate placement portion for placement thereon of the processing target substrate.

* * * * *